United States Patent [19]
Pressly et al.

[11] Patent Number: 5,889,788
[45] Date of Patent: Mar. 30, 1999

[54] WRAPPER CELL ARCHITECTURE FOR PATH DELAY TESTING OF EMBEDDED CORE MICROPROCESSORS AND METHOD OF OPERATION

[75] Inventors: Matthew D. Pressly; Grady L. Giles; Alfred L. Crouch, all of Austin, Tex.

[73] Assignee: Motorola, Inc., Schaumburg, Ill.

[21] Appl. No.: 794,742

[22] Filed: Feb. 3, 1997

[51] Int. Cl.[6] .................................................. G06F 11/00
[52] U.S. Cl. ..................................... 371/22.31; 371/22.32
[58] Field of Search .............................. 371/22.31, 22.32, 371/22.34, 22.5, 27.5; 395/183.06

[56] References Cited

U.S. PATENT DOCUMENTS

| | | | |
|---|---|---|---|
| 4,564,943 | 1/1986 | Collins et al. | 371/28 |
| 5,054,024 | 10/1991 | Whetsel | 371/22.3 |
| 5,220,281 | 6/1993 | Matsuki | 324/158 |
| 5,229,657 | 7/1993 | Rackley | 307/443 |
| 5,260,947 | 11/1993 | Posse | 371/22.3 |
| 5,260,949 | 11/1993 | Hashizume et al. | 371/22.3 |
| 5,260,950 | 11/1993 | Simpson et al. | 371/22.3 |
| 5,285,453 | 2/1994 | Gruodis | 371/22.31 |
| 5,381,420 | 1/1995 | Henry | 371/22.5 |
| 5,592,493 | 1/1997 | Crouch et al. | 371/22.3 |
| 5,600,787 | 2/1997 | Underwood et al. | 395/183.06 |
| 5,638,380 | 6/1997 | De | 371/22.3 |
| 5,642,362 | 6/1997 | Savir | 371/22.31 |
| 5,717,700 | 2/1998 | Crouch et al. | 371/22.31 |
| 5,717,702 | 2/1998 | Stokes et al. | 371/22.35 |
| 5,748,645 | 5/1998 | Hunter et al. | 371/22.3 |
| 5,748,647 | 5/1998 | Bhattacharya et al. | 371/22.31 |

Primary Examiner—Robert W. Beausoliel, Jr.
Assistant Examiner—Scott T. Baderman
Attorney, Agent, or Firm—Keith E. Witek

[57] ABSTRACT

An integrated circuit contains customer specified logic (12), an embedded core (14), and a plurality of speed path test cells (16 and 18). Once the core (14) is embedded within an integrated circuit (10), not all of the input and output terminals of the embedded core are available at external terminals of the integrated circuit (10). Therefore, the wrapper speed path test cells (16 and 18) are provided. The cell (16) contains two flip-flops (20 and 22) which can be used to launch logic transitions into the embedded core (14) to perform two clock speed path testing. The cell (18) contains flip-flops (26 and 28) which can perform a speed path launch operations to a customer specified logic (12). The cell (16) can perform speed path capture operations for the customer specified logic (12) whereas the cell (18) can perform speed path capture operations for the embedded core (14).

35 Claims, 6 Drawing Sheets

WRAPPER CELL ARCHITECTURE FOR PATH DELAY TESTING OF EMBEDDED CORE MICROPROCESSORS AND METHOD OF OPERATION

FIELD OF THE INVENTION

The present invention relates generally to testing of integrated circuits, and more particularly to, speed path testing of conductive paths in an integrated circuit containing an embedded core central processing unit (CPU).

BACKGROUND OF THE INVENTION

In the modern integrated circuit industry, there is a class of integrated circuits known as microcontrollers or "system-on-a-chip" devices. These devices are manufactured and designed to contain embedded core data processors wherein this embedded core communicates with peripherals, memory, or other circuitry on the same substrate. The embedded core may be designed and/or provided by the integrated circuit (IC) manufacturer, or may be designed and/or provided by a third party (not the customer or the integrated circuit manufacturer), whereas the peripherals and other circuitry is typically customer specific. In many cases, the customer specific material is provided and/or designed by a different party from that which designed/provided the embedded core. Therefore, testing of integrated circuits is made increasingly difficult due to the many parties and design/test methodologies that may be involved in the design as well as the inaccessibility of circuit elements embedded deep within a microcontroller design. As more embedded core processors, or "system-on-a-chip" devices are designed, or as the level of integration increases such that many embedded cores from many providers are included on a single device, new test methods must be used.

The embedded core, which is only a portion of the total integrated circuit (IC) and is surrounded by peripherals, typically contains a plurality of input and output terminals. If the embedded core is kept as a separate structure during test pattern generation and is not bundled together with the rest of the integrated circuit logic for test pattern generation, then there is an access problem (controllability and observability) related to these plurality of input and output terminals (e.g., the input and output terminals used to test the embedded core are not accessible by the microcontroller external terminals or package pins). In most cases, the plurality of input and output terminals of the embedded core are not directly accessible by the external pins of the integrated circuit, and therefore, no direct access is available to the embedded core for providing test vectors or for other test purposes.

In addition, the complexity and transistor count of integrated circuits (ICs) has significantly increased so that simple connectivity testing and stuck-at fault testing is not adequate for modern microcontrollers. It is important that the embedded core be tested for frequency compliance, input and output terminal timing specification compliance, manufacturing induced path delay faults and transition delay faults, in addition to stuck-at faults and connectivity. It is even more advantageous if the speed path verification tasks can be performed at the operational frequency of the embedded core.

One prior art method for overcoming these design and access difficulties to the embedded core is to provide a signal path between every input terminal and every output terminal of the embedded core and a different external pin of the integrated circuit. This architecture, commonly known as "multiplexor mode", creates significant overhead in the design. In addition, routing of the signal path for "multiplexor mode" may not be possible since the number of input/output terminals on the embedded core may exceed the number of external pins of the integrated circuit (IC). In addition, this method of signal path routing can complicate the testing of the timing of the inputs and outputs to the embedded core. Furthermore, this method can result in a lower quality test program, an impact to the device die area, or an impact to the design schedule (i.e., being late to market with microcontroller design derivatives). For example, to conduct a reasonable speed or timing test would require that each signal path connection for the device package pins to the embedded core inputs and outputs be fully characterized at each operating point (temperature and supply voltage) at which the device is to be tested. This characterization will never result in a fixed propagation delay along such a signal path, but will always provide a range of possible values for that propagation delay (minimum and maximum) due to process variation in the manufacture of such products. The magnitude of the range from the minimum to maximum propagation delay for each of these signals introduces an uncertainty into the measurement or validation of embedded core input and output specifications along such propagation paths. This additional uncertainty leads to either a reduced test quality, yield reduction, or both.

Another method for overcoming the design and access difficulties is to provide a wholly serial connection whereby the embedded core input and output terminals are provided data, or are interrogated for data, respectively, by using a common-in-the-art serial scan connections. This method has the drawback of increasing test time unreasonably and not allowing at-speed testing to occur. For example, an embedded core with 100 input terminals and 100 output terminals would require 200 clock cycles to provide and interrogate one data processor cycle of terminal data. A vector set with 1000 data processor clock cycles worth of test data would be extended or multiplied by 200 and would result in an actual applied clock cost of 200,000 clock cycles. The effective frequency tested would also be reduced by 200 so a 200 MHz data processor would effectively be tested at 1 MHz.

In another prior art method, the embedded core and associated peripherals can be placed on a single chip and modeled together in such a way that the whole chip design is considered as a single entity where the embedded controller is not individually testable. For this type of design the test vectors are generated for the entire integrated circuit (IC) whereby the hierarchy of the sub-components of the microcontroller are ignored. This method is typically time inefficient since each and every integrated circuit which contains the same embedded core must be separately processed to create new test vectors whereby existing or old embedded test vectors must be discarded. This design process is generally not supported in the industry due to the intellectual property content of the embedded core data processor or of the customer supplied logic. Most suppliers of embedded cores and peripherals do not desire to disclose extensive details of there designs thereby rendering new generation of test vectors very difficult after full integration.

It would be advantageous to generate an initial set of test vectors when designing the embedded core and provide a method and system to allow the use of these initial test vectors to perform testing on the embedded core regardless of which peripherals are integrated with the embedded core. It would be advantageous to provide a method which would decouple the embedded core test process from customer specific designs and peripherals which may be located on the same substrate with the embedded core. A new isolated embedded core test process is needed since most customer specific designs use different test methodologies from that originally designed into the embedded core and may contain proprietary information which cannot be communicated to the manufacturer of the embedded core. In addition, it is important that the substrate surface area overhead associated with this embedded core test circuitry be minimized.

Therefore, the need exists for a method and system which allows for speed path and at-speed testing of embedded core designs whereby test vectors can be reused and access to the embedded core is enabled in a substrate-space efficient manner.

Figure 1:
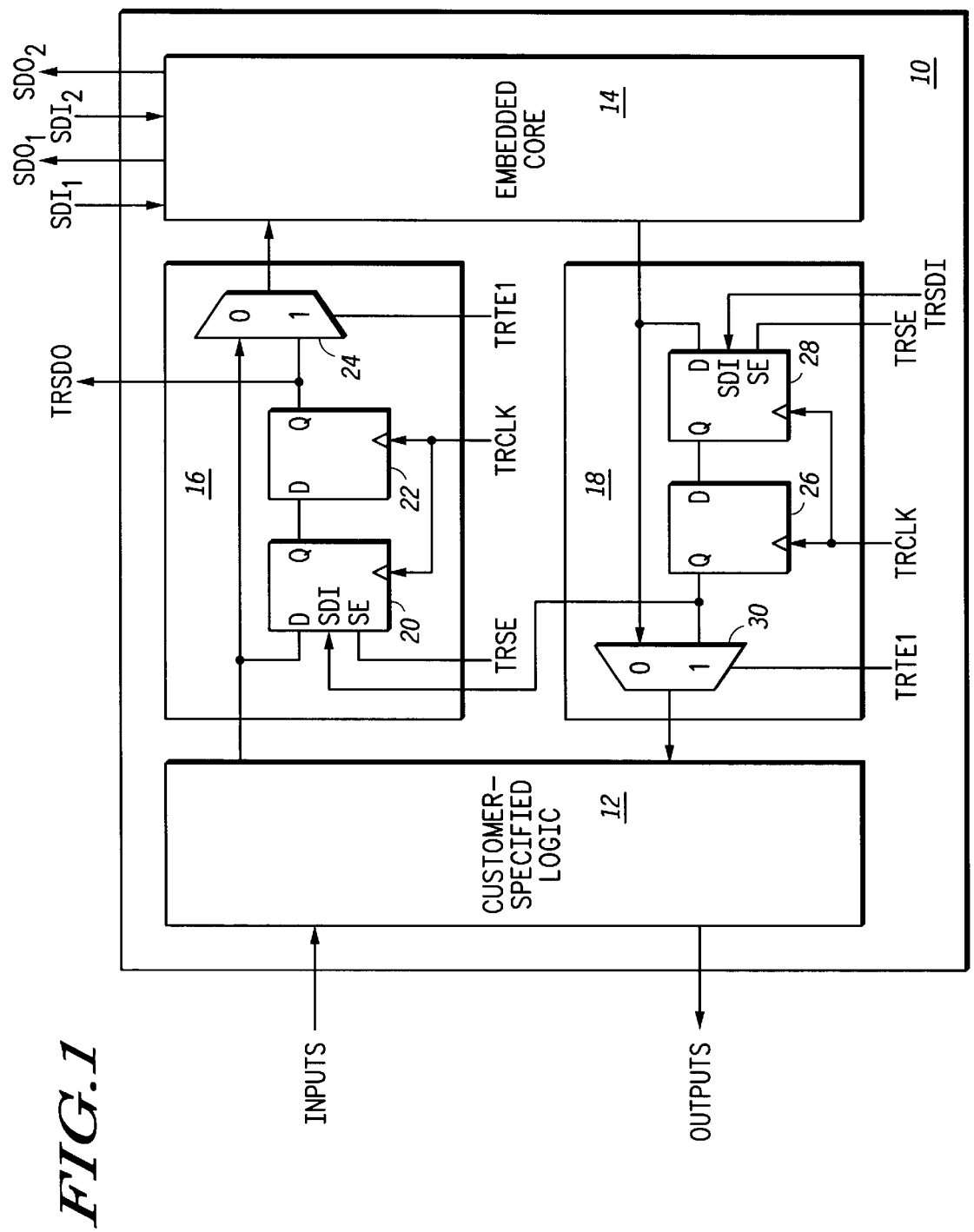
FIG. 1 illustrates, in a block diagram, an integrated circuit containing speed path test cells for testing an embedded core in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

Description of a Preferred Embodiment

Overview

Generally, the present invention is a method and system for testing an embedded core data processor within an integrated circuit (IC). In order to allow for speed path testing (also referred to as critical path testing), logic transition delay testing, and similar at-speed testing, a set of wrapper cells or plurality of speed path test cells are provided around a periphery of the embedded core. The plurality of speed path test cells are coupled to the inputs and outputs of the embedded core and may also interface to peripheral circuitry and other logic integrated onto the same substrate with the embedded core. Therefore, the plurality of speed path test cells allow access to the otherwise inaccessible inputs and outputs of the embedded core to enable speed path testing and like at-speed testing of the embedded core. It must also be noted that the plurality of speed path test cells also allow speed path testing of the peripheral and other integrated logic that interfaces to the embedded terminals of the embedded data processor (since these terminals are equally inaccessible in the absence of a test structure).

In addition, the test vectors created when the embedded core was designed are capable of testing the embedded core regardless of how the embedded core is subsequently integrated with any other customer specific logic or on-chip peripherals. It is advantageous that the same test vectors are applicable for any microcontroller derivative product which is subsequently designed to contain the embedded core since it saves time, avoids proprietary disclosure, and enables the rapid development of derivative products containing the same core. The overhead substrate surface area of the plurality of speed path test cells is minimal. In addition, the plurality of speed path test cells may provide at-speed test capability for customer specific on-chip portions.

Manufacturing tests for any integrated circuit (IC) device should ideally ensure that there exist no manufacturing-induced defects that either: (1) prevent the device from performing the functions that it is specified to perform in the functional or operational specification; or (2) prevent the device from meeting all its functional timing specifications. The prior art method for high-quality tests to meet these two requirements are to fully scan all sequential elements in the design, and use automatic test pattern generation (ATPG) software to generate stuck-at, transition delay, and path delay patterns for the entire integrated circuit. However, if one hundred microcontrollers are designed using the same embedded core, then one hundred different sets of test vectors must be generated and maintained to test the one hundred different microcontrollers.

The present invention enables the testing of embedded cores without the need for performing ATPG every time the embedded core is integrated into a new microcontroller design. Embedded cores are groups of logic that are reused in multiple different microcontroller designs. Any one embedded core is integrated either alone or with other cores onto an integrated circuit (IC) which contains other logic to perform other specific functions unique to each microcontroller. In some cases, the logic provided on the same substrate with the embedded core is customer-designed and the details of this design are not provided to the embedded core designer. The design methodology and test strategy used by the customer for the logic external to the core may be entirely different from that employed in the embedded core. Because the logic surrounding the core is different from one application to the next, it is desirable to insulate the embedded core from the surrounding logic so that test patterns can be developed for that core and reapplied without the need for significant change for each new application of the embedded core. Also, it is not always possible to require that the customer-specified logic surrounding the embedded core be fully scanned via scan chain designs. Most customer designs and simpler peripherals are not held to higher scan design standards of embedded cores and required to do all of stuck-at, transition delay, and path delay testing which is required for modern embedded cores. In such cases, the controllability of input signals to the core and observability of output signals from the core, both of which are required to produce high-quality tests for the embedded core, are lacking when not using the devices taught in FIGS. 1–3.

When performing speed path testing, a logic transition is "launched" at a start of a circuit path and speed path test data is "captured" at the end of the circuit path. Therefore, a speed path test is a two-clock-edge test. One clock edge performing the "launch" and another clock edge performing the "capture". In some cases, a clock edge of a first clock signal performs the "launch" where a clock edge of a second clock signal performs the "capture". In other cases, the same clock enables both "launches" and "captures" via two sequential edges.

"Launching a transition" on an input to a cone of combinational logic is the application of a 0→1 transition or 1→0 transition on an input terminal of a circuit path. It is desirable, though not absolutely necessary, to apply the transition while holding all other inputs to the cone of logic at a constant (unchanging) logic value so that the speed path in question is not adversely logically affected by logic fluctuations on adjacent circuit paths. When all "off-path" values involved with the circuit path are held stable, the test is known as a "robust" test, and much less likely to be corrupted. Note that multiple timing paths may be robustly tested concurrently if their respective logic cones are disjoint. This concurrent multiple path test would be done by launching transitions on the input terminals of each path while holding other inputs to each of the logic cones constant. In order to test input timing specifications for the embedded core, the design is able to launch (on a first clock event) transitions onto core inputs. These transitions then propagate through zero or more combinational logic gates and the resulting data values at the path endpoints are captured (on a second clock event) into a state element (latch or flip-flop) within the embedded core. The transition should be launched with appropriate timing such that the input has an interval of time in which to propagate and be captured, and that interval should not exceed the length of the worst-case timing specification for that input. Since input timing specifications vary from one port on the core to the next, there is a need to launch transitions at different times relative to the internal system clock(s) of the core. Therefore, the launch circuitry (formed by the plurality of speed path test cells) is run by a separate test clock so that set-up times, hold times and like time periods can be tested via time differentials between system clock edges and test clock edges. These time intervals can range from very short time intervals, much less in duration than a system clock period, to larger intervals such as multiple system clock periods. Similarly, for core outputs, circuitry is provided to capture outputs from the core at an appropriate time interval after the application of the internal clock of the core. The duration of these intervals will vary from one port of the core to the next, as they are directly derived from the output timing specifications for the core outputs.

Note that the plurality of speed path test cells may be used to test customer specified logic in addition to the embedded core. To test the circuitry other than the core, the plurality of speed path test cells should provide launching transitions and hold stable values on customer logic inputs until speed path test data can be captured at the end of the circuit path.

The above speed path testing requirements are met by the design of a "wrapper" which is a plurality of storage elements which surrounds the core and through which inputs to the core and outputs from the core pass for test purposes. During normal functional operation (or normal mode of operation), the wrapper allows signals to cross from the customer-specified logic into the core unaltered, and similarly allows data to pass from the core to the customer-specified logic unaltered. Additionally, a test mode is provided whereby scanned sequential elements (the plurality of speed path test cells that create the "wrapper") provide controllability points for core speed path inputs (two flip-flops are needed for the two-clock-event speed path test) which are capable of launching transitions into core inputs for speed path testing at-speed. In addition, the plurality of speed path test cells in the wrapper also provide storage for capturing and observing embedded core outputs when an output of the embedded core is speed path tested.

Detailed Description

Figure 2:
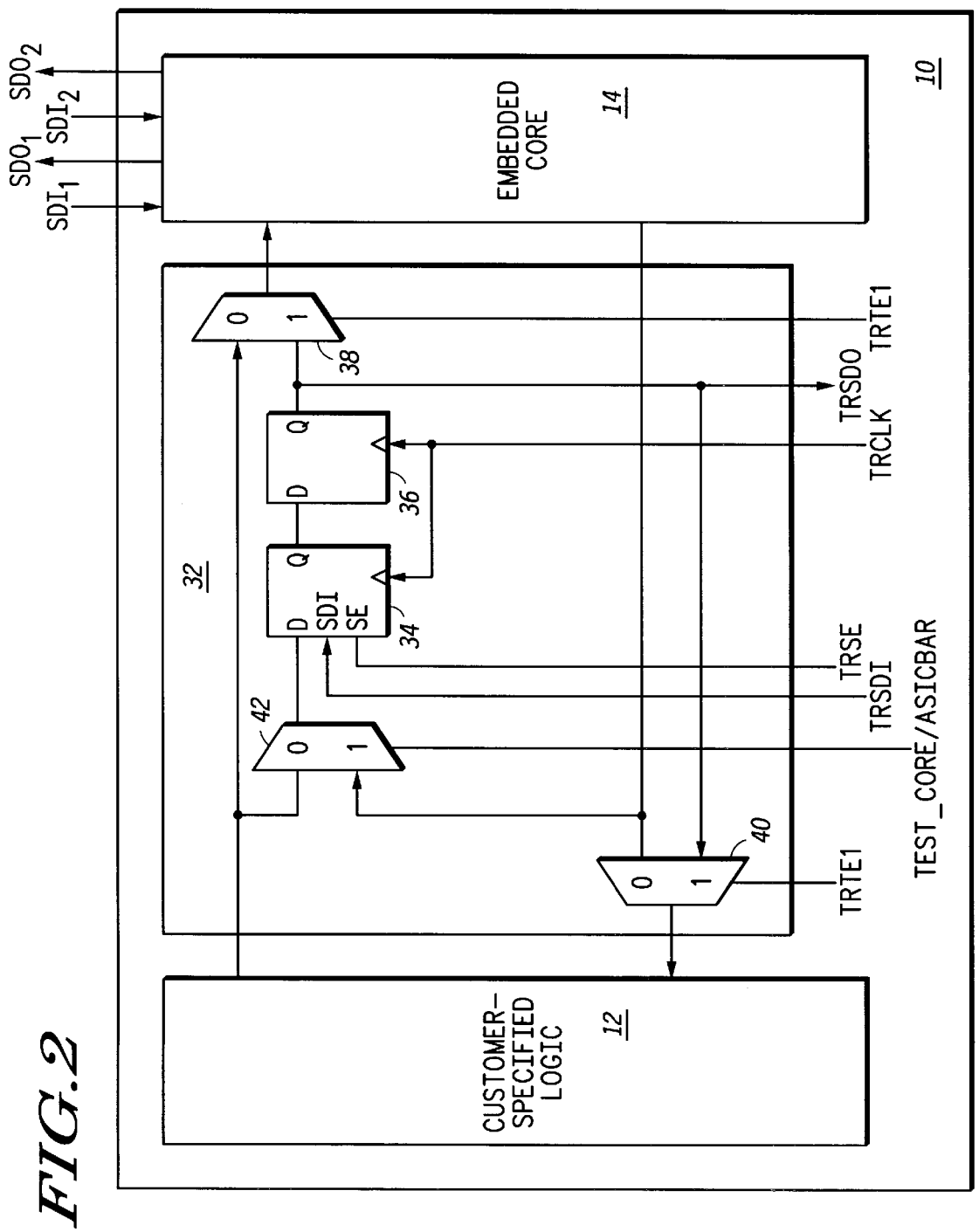
FIG. 2 illustrates, in a block diagram, another system containing speed path test cells which enable the testing of an embedded core in accordance with the present invention.
Figure 3:
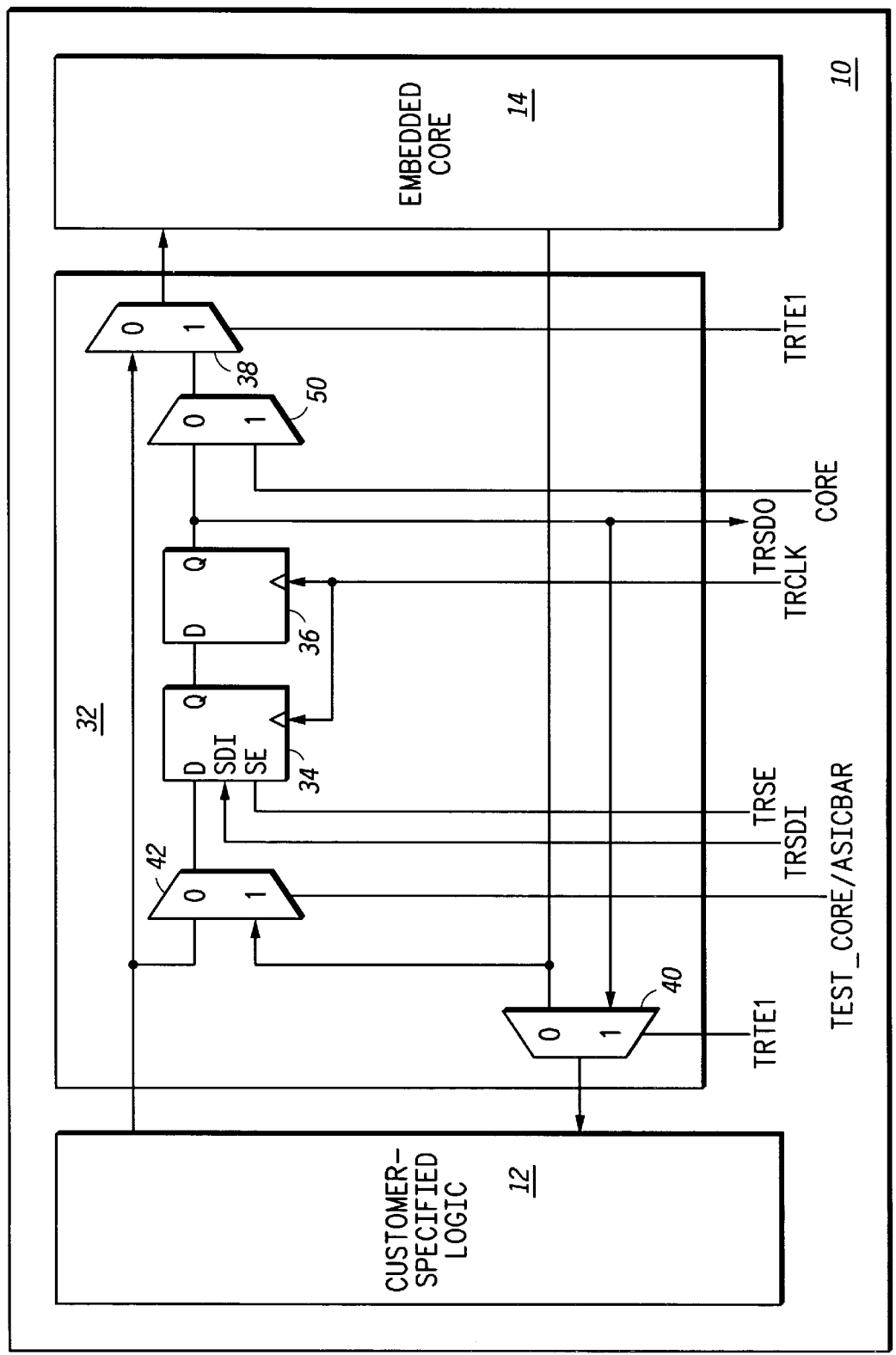
FIG. 3 illustrates, in a block diagram, yet another system which enables testing of an embedded core.

Now that the general purpose and advantage of a "wrapper" has been discussed, specific embodiments of the invention can be further understood with reference to FIGS. 1–3.

FIG. 1 illustrates an integrated circuit (IC) 10. Integrated circuit 10 contains two primary circuit portions referred to in FIG. 1 as customer specified logic 12 and an embedded core 14. The embedded core 14 is a data processor or a central processing unit (CPU) which executes computer instructions and/or processes data within the integrated circuit 10. The customer specified logic 12 is any logic that is coupled to the embedded core to allow for microcontroller functions in addition to the embedded core. For example, the customer specified logic 12 can be any one or more of a memory array (RAM, EEPROM, EPROM, flash, nonvolatile memory, etc.), an A/D converter, a D/A converter, a filter, an input port, an output port, a timer, a peripheral interface, a serial communication interface (SCI), another embedded core, or any logic circuitry which can be integrated on the same substrate material with the embedded core to form a complete microcontroller. Any IC can contain more than one embedded core and/or more than one customer-specified logic section and only one of each is illustrated in FIG. 1 by way of example.

In many cases, the customer specified logic 12 performs most of the communication with the external terminals of the integrated circuit 10 via the inputs and outputs illustrated in FIG. 1. A smaller portion of the total number of external terminals of the IC 10 are provided to the embedded core 14 (all of the terminals of the embedded core 14 are not available at external terminals of the IC 10). These terminals provided to the embedded core 14 from the external terminals of the IC 10 may either be time division multiplexed for other microcontroller purposes or may be specifically dedicated to specific embedded core functions.

FIG. 1 illustrates that the embedded core 14 contains a plurality of internal flip-flops (not specifically illustrated in FIG. 1) which are connected in one or more serial scan chains. Embedded core 14 of FIG. 1 illustrates two serial scan chains. FIG. 1 illustrates a first scan data input (SDI1), which provides input serial scan data to the first flip-flop in a first plurality of flip-flops, and a first scan data output (SDO1) which provides serially scanned data out from the last flip-flop in a first plurality of flip-flops within the core 14, to form a first scan chain. A second scan chain of a second plurality of flip-flops within core 14 is formed via a second scan data input (SDI2) which has a second scan data output (SDO2).

In addition to the customer specified logic 12 and the embedded core 14, speed path test cells 16 and 18 are illustrated in FIG. 1. A wrapper surrounding the embedded core 14 will contain many cells similar to 16 and 18, however, only two cells 16 and 18 are illustrated in FIG. 1 by way of example. The speed path test cell 16 is a cell which provides speed path "launch" capability to an input of the embedded core 14 while providing speed path test data "capture" ability for an output of the customer specified logic 12. Conversely, the speed path test cell 18 provides speed path logic transition "launch" capability for the customer specified logic 12 while providing speed path test data "capture" functionality for the embedded core 14. Therefore, the cell 16 receives an input from the customer specified logic 12 and provides an output to the embedded core 14 when enabled, whereas the cell 18 receives input from the embedded core 14 and provides an output to the customer specified logic 12 when enabled. It is important to note that both the customer specified logic 12 and the embedded core 14 will contain a plurality of inputs and a plurality of outputs. Therefore, in most embodiments, a plurality of the cells 16 are resident within the integrated circuit 10, and a plurality of cells 18 are also resident within the integrated circuit 10 to allow for testing of the many inputs and output to the core 14 and the logic 12.

The cell 16 contains three circuit elements. Cell 16 contains a multiplexor (MUX) 24, a first flip-flop 22, an a second flip-flop 20. The multiplexor 24 of cell 16 has a first input labeled as 0 which, when enabled, provides a normal mode data path (i.e., non-speed-path-test path) between the customer specified logic 12 and the embedded core 14. Therefore, when no speed path testing is enabled for the integrated circuit 10, the 0 path of the multiplexor 24 is enabled so that the customer specified logic 12 can communicate with the embedded core 14 in a normal mode of operation. When the integrated circuit 10 is placed into a speed path test mode, the test ring test enable signal (TRTE1) is set so that the path 1 for the multiplexor 24 is selected. The normal mode of operation versus the scan input/output are enabled by the use of the test ring select enable (TRSE) in FIG. 1 and the test enable (TRTE1) signal.

Cell 16 contains two flip-flops 22 and 20 since two flip-flops are used to perform the two-clock-cycle speed path test functions as previously discussed. The flip-flops 22 and 20 are connected in a serial scan chain which is independent and separate from the two serial scan chains illustrated for the embedded core 14 in FIG. 1. Therefore, the flip-flops 22 and 20 of FIG. 1 are connected in series between a test ring scan data input (TRSDI) and a test ring scan data output (TRSDO) to form a wrapper scan chain. It is important to note that hundreds or thousands of flip-flops similar to flip-flops 22 and 20 can be contained within the wrapper scan chain of FIG. 1.

When placed into a test mode of operation, the flip-flops 22 and 20 can be loaded with one of four logic states. The flip-flop pairs within any speed path test cell 16 or 18 can be programmed to contain a 0-0, 0-1, 1-0, and 1-1. When the flip-flops 20 and 22 are programmed to a 1-1 state or 0-0 state, the flip-flops 20 and 22 are to provide a stable value to an input of the embedded core 14 for two consecutive clock cycles so that speed path testing can be performed on another input to the embedded core 14 in a stable or robust manner. When the flip-flops 20 and 22 are programmed with a 0-1 or a 1-0 state, then the flip-flops 20 and 22 are providing a high-to-low or low-to-high logic transition to the input of the embedded core to enable speed path testing, hold time testing, and setup time testing of the input of the embedded core 14.

In addition to providing speed path launch capability to the embedded core 14, the flip-flop 20 provides speed path capture ability for the customer specified logic 12. Therefore, the output from the customer specified logic 12 can be speed path tested, clock-to-output-valid time tested, or output hold time tested by using the flip-flop 20 as a capture point.

The cell 18 operates in the reverse manner of that previously discussed for cell 16. Basically, cell 18 is the mirror of cell 16 and contains similar flip-flops 26 and 28 and a similar multiplexor 30. Cell 18 provides speed path launch capability to the customer specified logic 12 whereas the cell 18 provides speed path capture capability for an output of the embedded core 14. It is important to note that speed path testing of the input of the embedded core 14 and speed path testing of the input of the customer specified logic 12 can be performed in parallel by simultaneously launching test transitions from the cells 16 and 18 at an overlapping time. Therefore, the circuitry of FIG. 1 illustrates a system whereby the embedded core and the customer specified logic 12 can be speed path tested at-speed and simultaneously.

Furthermore, FIG. 1 illustrates that a dedicated test ring clock signal (TRCLK) is provided to the flip-flops within cells 16 and 18. The signal TRCLK is preferably not provided to the customer specified logic 12 or the embedded core 14. The embedded core 14 is typically provided with one or more system clock signals not illustrated in FIG. 1 and the customer specified logic may be either provided with the same system clock signal(s) or with different clock signal(s) which are different from the embedded core's clock signal. By using a TRCLK signal to control the cells 16 and 18, several advantages are obtained. In one form, the system clock edges controlling the embedded core 14 and the TRCLK edges controlling the cells 16 and 18 can be offset by a small time period (a few nanoseconds or picoseconds). This small time period allows for setup time and hold time testing which can occur over time periods which are substantially less than the time period defined by the system clock. Therefore, time critical test measurements can be obtained for the embedded core 14 and the customer specified logic 12 wherein this time critical information is substantially less in time than a period of the system clock. Alternatively, the time periods for setup time and hold time measurements could be larger than a system clock period.

The circuit of FIG. 1 enables verification or testing of the embedded core 14 which may be controlled by one or multiple system clocks, and the logic 12, which also may be controlled by one or many system clocks. The test clock can be used to remove frequency conflicts between the logic 12 and the core 14.

FIG. 2 illustrates an alternate embodiment to that illustrated in FIG. 1. FIG. 2 illustrates the integrated circuit 10 which contains the customer specified logic 12 and the embedded core 14. The embedded core 14 contains the same two internal serial scan chains as illustrated and discussed with respect to FIG. 1. The primary difference between FIG. 2 and FIG. 1 is the circuitry within the speed path test cells which form the wrapper or test ring. FIG. 2 illustrates a speed path test cell 32 which combines most of the functionality of both of the cells 16 and 18 in FIG. 1. While the cell 32 of FIG. 2 combines most of the functionality of the cells 16 and 18 in a substrate surface area which has been reduced, the test cell of FIG. 2 does not allow for simultaneous testing of the customer specified logic 12 and the embedded core 14. In other words, the cell 32 of FIG. 2 can only be used to launch and capture speed path data for the embedded core 14 or for the customer specified logic 12 but cannot perform test operations concurrently on both core 14 and logic 12.

Cell 32 contains five primary circuit elements. Cell 32 contains two flip-flops 34 and 36 and three multiplexors 38, 40, and 42. The flip-flops 34 and 36 perform a function similar to the flip-flops 20 and 22 or flip-flops 26 and 28 of FIG. 1. When in a normal mode of operation, the multiplexor 38 and the multiplexor 40 are set so that the path 0 of the multiplexors 38 and 40 are utilized. When the path 0 of the multiplexors 38 and 40 are utilized, no speed path testing is occurring and a normal mode of operation is functional within the integrated circuit 10. When enabling speed path testing, the multiplexors 38, 40, and 42 can be configured in one of several different configurations. In a first configuration, the flip-flops 34 and 36 provide speed path launch capability through the path 1 of multiplexor 38 to an input of the embedded core 14. In this launch configuration, the multiplexor 40 can also provide a two clock speed path transition to an input of the customer specified logic 12. The multiplexor 42 is provided with a select signal labeled "test_core/asicbar". The test_core/asicbar signal is used to configure the flip-flop 34 to provide capture functionality.

If an output of the customer specified logic 12 is to be speed path tested, the test_core/asicbar signal is deasserted, so that the input of the multiplexor 42, which is coupled to the customer specified logic 12 is enabled. When this path is enabled, the output of the logic 12 is latched within the test cell to the flip-flop 34 on a second clock cycle of a speed path test so that the flip-flop 34 performs output speed path capture for the logic 12. If an input to the customer specified logic 12 is to be speed tested, then TRTE1 is asserted, so that the multiplexor 40 couples the output of flip-flop 36 to the customer logic input being tested, such that when TRCLK is asserted, it launches a transition from flip-flop 36 through multiplexor 40 onto the customer logic input.

When the test_core/asicbar signal is asserted, then the flip-flop 34 functions to perform capture operations for an output of the embedded core 14. Therefore, the cell 32 of FIG. 2 can perform a launch operation to the embedded core 14 while simultaneously performing a capture operation from the embedded core 14. In addition, the circuitry of FIG. 2 can simultaneously perform a launch operation to the customer specified logic 12 while performing a capture operation from the logic 12. However, it is not possible for the cell 32 of FIG. 2 to perform a dual capture operation due to the fact that FIG. 2 contains fewer flip-flops than that illustrated in the embodiment of FIG. 1 (in general, the dual launch operation is also not supported as a method since testing is generally performed on the embedded core 14 or the customer specified logic 12 as separate steps in the test process). Note that core_test/asicbar is treated as a static signal, meaning that it is asserted or deasserted, then a series of either core tests or customer logic tests are run with no transitions on core_test/asicbar. Then core test/asicbar would be transitioned once, then another series of tests would be run on the remaining logic section (of 12 and 14).

FIG. 3 illustrates an alternate embodiment of FIG. 2. FIG. 2 illustrated that the scan chains provided to the embedded core 14 were provided on either time multiplexed or designated pins coupled to an external package of the integrated circuit 10. FIG. 3 illustrates that an additional multiplexor 50 can be placed within the cell 32 to allow for the serial scan chains within the embedded core to be passed through the multiplexor 38. While the design of FIG. 3 illustrates that the multiplexor design of the cell 32 is more complicated, the use of dedicated of external pins in multiplexors to the embedded core 14 for the purpose of providing scan data has been simplified. Therefore, FIG. 3 illustrates an alternate embodiment to that of FIG. 2 wherein the scan data paths for the embedded core can be configured and provided to the embedded core 14 in a different manner.

It should be noted that when the wrapper scan chains are substantially balanced in bit-length to the embedded core 14 scan chains (i.e., all scan chains have similar or exactly the same number of scan shift elements), an optimized testing condition results where the logic state of the embedded core is installed at the same clock cycle that the logic state of the embedded core terminals is established. This architecture and test methodology allows for testing of all fault models, stuck-at and delay, in an efficient manner. Since a plurality of scan chains may be loaded or shifted in a parallel manner (and there are fewer of these terminals that the general case of providing direct signals to all embedded terminals), and the embedded terminal values are loaded or shifted simultaneously, then the embedded core 14 can be tested for all fault models, and with a lesser clock cycle cost than the wholly serial method.

The addition of multiplexor 50 to cell 32 allows the embedded core's scan chains to be loaded simultaneously with the wrapper scan chains when the embedded core's scan chain terminals are borrowed from functional terminals, or when no embedded core 14 terminals interface to any customer specified logic 12 or the external package without passing through the test wrapper.

Figure 4:
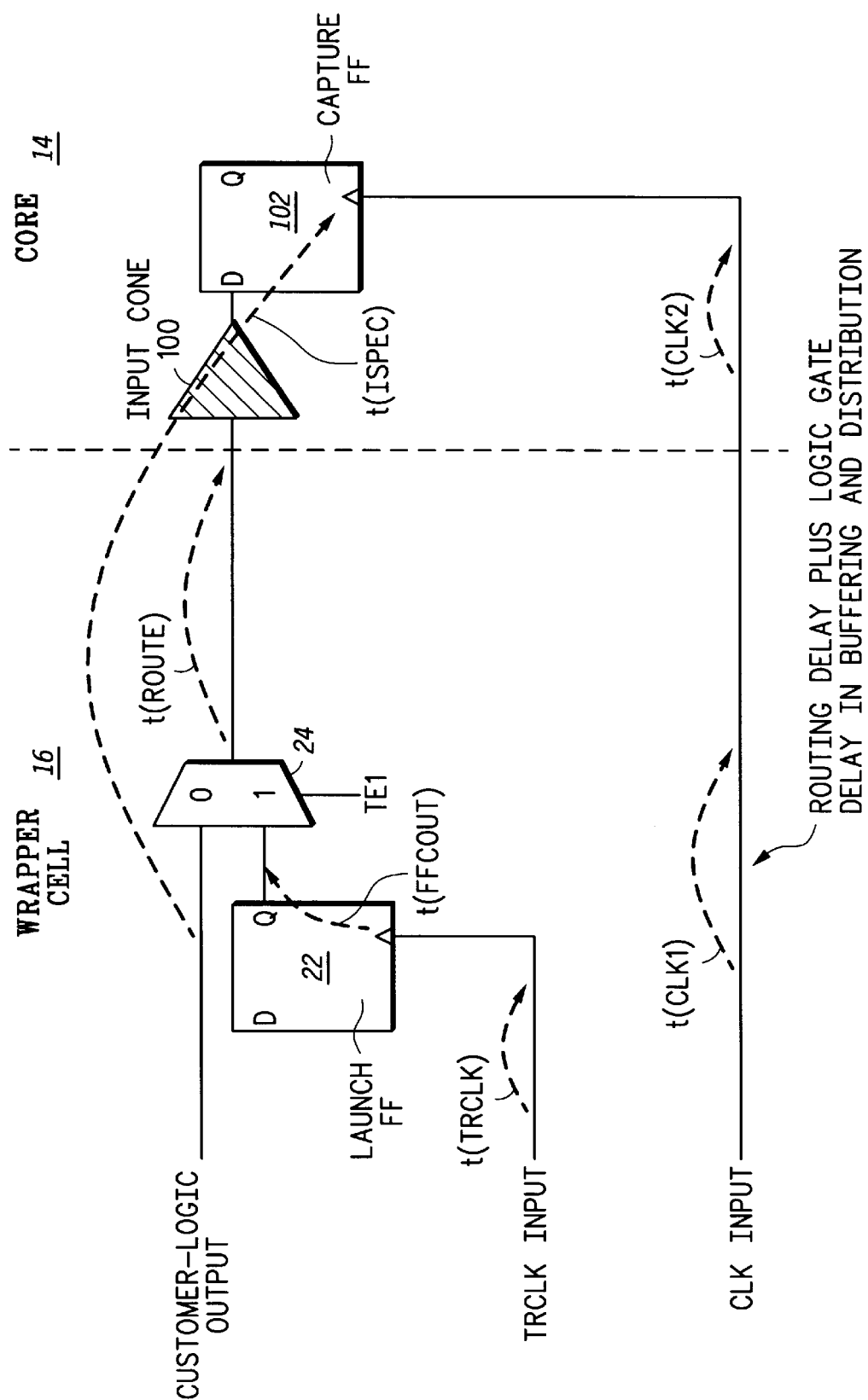
FIG. 4 illustrates, a circuit schematic, timing delays associated with using a wrapper cell to test timing specification for an embedded core input port in accordance with the present invention.
Figure 5:
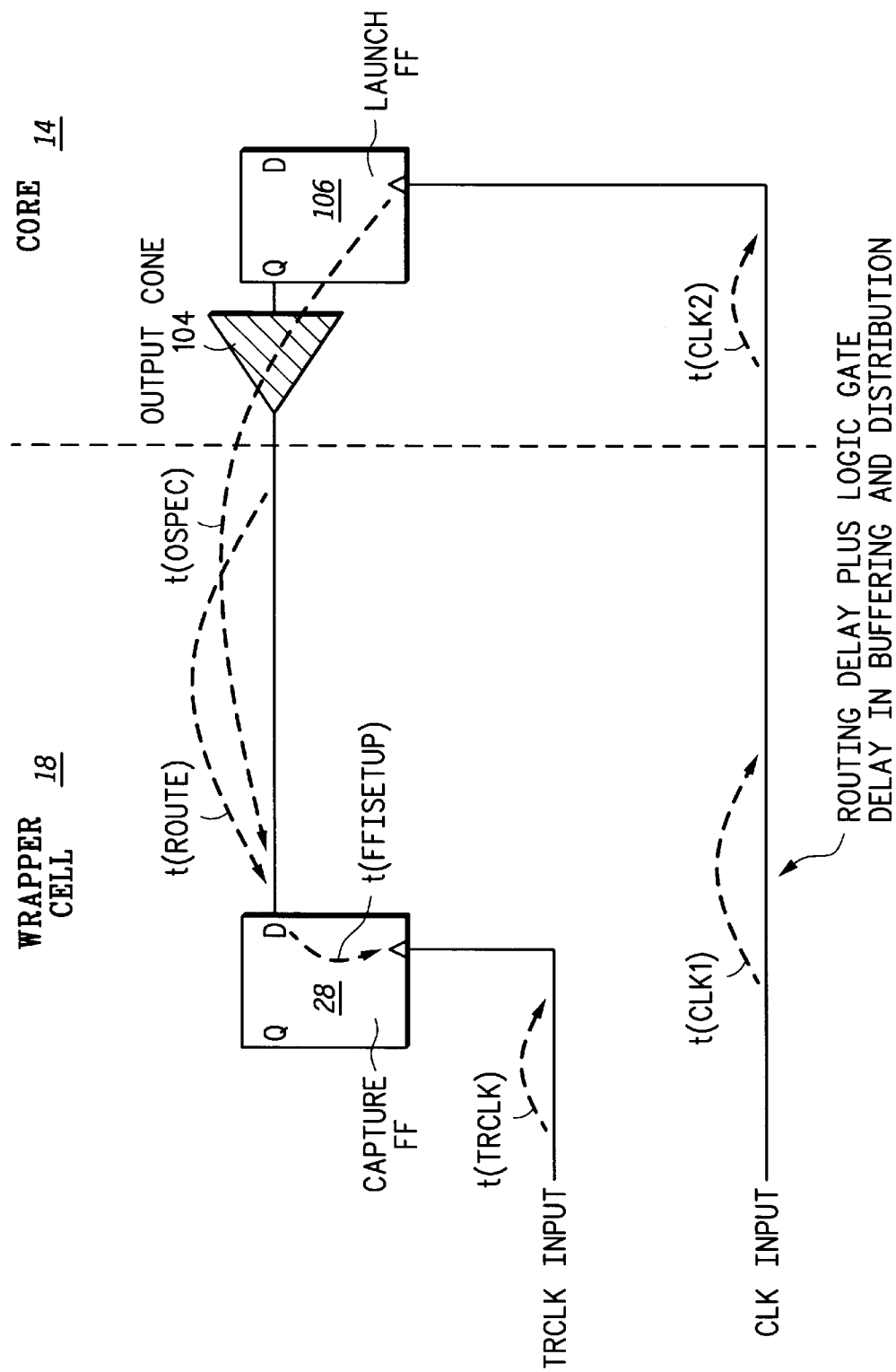
FIG. 5 illustrates, a circuit schematic, timing delays associated with using a wrapper cell to test timing specification for an embedded core output port in accordance with the present invention.
Figure 6:
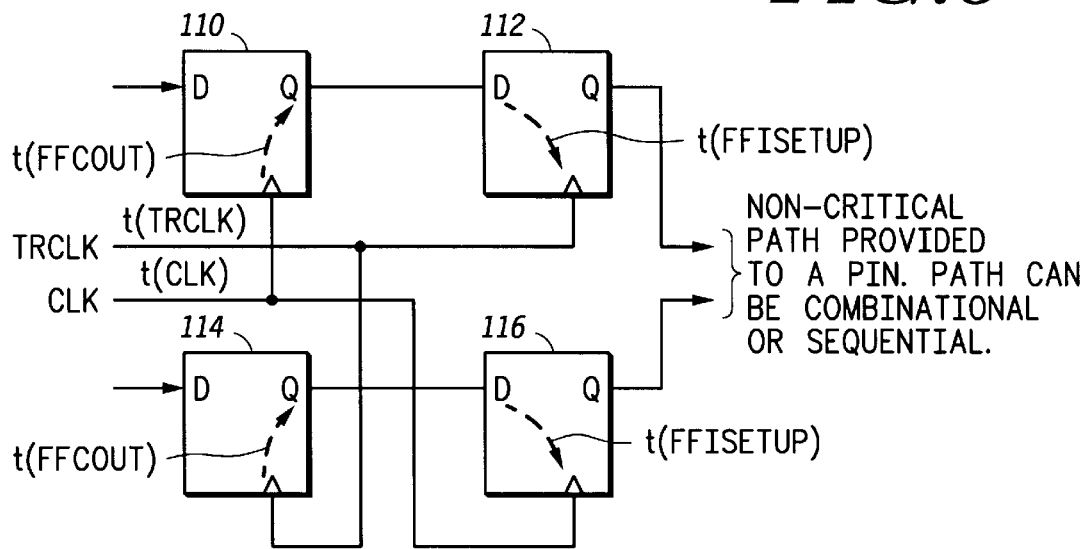
FIG. 6 illustrates, a circuit schematic, a measurement circuit which allows for measurement of the skew between two clock signals and other circuit characteristics in accordance with the present invention.
Figure 7:
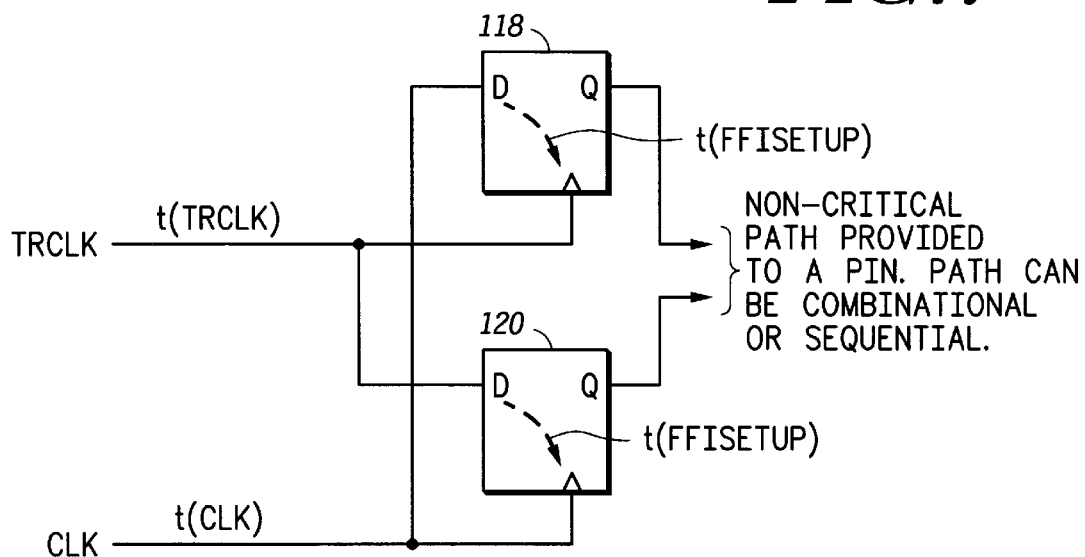
FIG. 7 illustrates, a circuit schematic, a measurement circuit which allows for measurement of the skew between two clock signals and input set-up circuit characteristics in accordance with the present invention.
Figure 8:
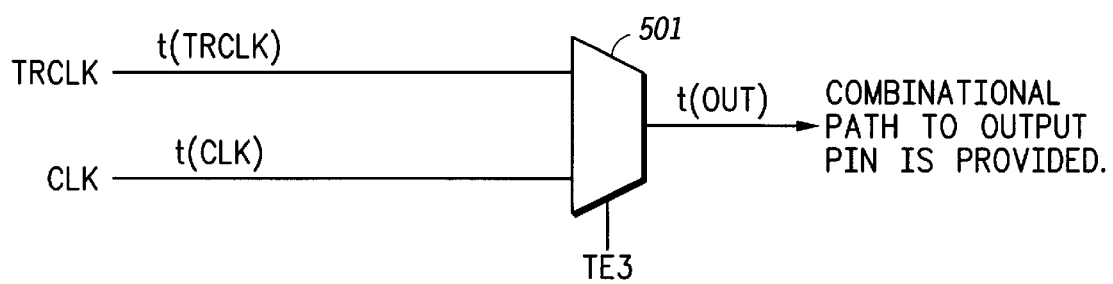
FIG. 8 illustrates, a circuit schematic, a measurement circuit which allows for measurement of the skew between two clock signals in accordance with the present invention.

FIG. 4–5 illustrate the inherent timing delays of the wrapper illustrated in FIG. 6. FIGS. 6–8 illustrate test structures which can be integrated on-chip with the embedded core to allow the timing uncertainty from FIGS. 4–5 and the clock skew between the test clock (TRCLK) and the system clock for the core 14 or the logic 12 to be detected and removed from the timing test data results. Therefore, the information provided by the circuits of FIGS. 6–8 allows for timing uncertainty from original embedded core test vectors to be measured and eliminated from the embedded core test data. Furthermore, the elimination of this uncertainty allows for timing specifications such as flip-flop set-up time, flip-flop input hold time, clock-to-output-valid time, and output hold time to be measured for an embedded core.

FIG. 4 shows the timing delays associated with the use of a speed path delay wrapper architecture 16 to test input setup time or input hold time for an input terminal of the embedded core 14. Elements in FIG. 4 that are analogous to elements in FIG. 1 are labeled with identical numerals. In FIG. 4, multiplexor 24 (see also FIG. 1) selects between the normal system data from customer logic 12 and speed path data from the speed path launch flip-flop 22. Input cone 100 is a combinational logic cone within the embedded core 14 (not illustrated in FIG. 1). This combinational cone has at least one input where one of the inputs is coupled to multiplexor 24 as illustrated in FIG. 4. The output of input cone 100 is coupled to flip-flop 102 which is located within the core 14.

In FIG. 4, TRCLK and CLK are input pins to the integrated circuit 10. There is a TRCLK propagation delay, t(TRCLK), from the TRCLK input pin to the clock terminal on the launch flip-flop 22. The launch flip-flop 22 has a clock-to-output-valid delay, t(FFCOUT), which is the timing delay from a rising edge transition on the launch flip-flop's TRCLK input port to when data may switch on the Q output port of the launch flip-flop 22. There is a CLK input propagation delay, t(CLK1), from the CLK input pin of integrated circuit 10 to the embedded core 14 CLK input terminal. There is an additional system CLK core propagation delay, t(CLK2), from the embedded core 14 CLK input terminal to the flip-flop 102 clock input terminal. There is a launch path routing delay, t(ROUTE), which is a propagation delay from the output terminal of multiplexor 24 to the embedded core 14 input port. It is important to note that t(ROUTE) in FIGS. 4–5 is incorporated into the respective input or output timing specification. There is a delay known as the input setup time delay (or the input hold time), t(ISPEC), from an output of customer-logic 12 (coupled to multiplexor 24), through multiplexor 24, through the input cone 100, and into the flip-flop 102. Note that the input setup time encompasses the launch path routing delay. This input setup time, t(ISPEC), has a timing specification, which is the length of time prior to a capture edge on the embedded core system clock that the customer logic output must be at a stable logic value in order for that the effect of that logic value to be captured reliably into the capture flip-flop 102. The input hold time, also denoted as t(ISPEC), has a timing specification which is the length of the time after a capture edge on the embedded core system clock CLK that the customer logic 12 must remain at a stable logic value in order for that logic value to be captured reliably into the flip-flop 102.

Note that the timing specification depends on the definition of a reference clock, which is the embedded core system clock, CLK Note also that there are multiple points along the distribution network for the system clock which could be chosen as that reference point. For example, the reference point could be at the embedded core CLK input terminal, or it could be at the capture flip-flop 102 clock input terminal. Either such reference point is acceptable, if it is used consistently across all embedded core capture flip-flops (and embedded core launch flip-flops, which are to be discussed later).

FIG. 5 shows the timing delays associated with the use of a speed path delay wrapper architecture 18. This wrapper cell portion of FIG. 5 is used to test clock-to-output-valid time and/or output hold time for an output terminal to an embedded core 14. In FIG. 5, flip-flop 106 is the launch flip-flop. This flip-flop, along with zero or more other flip-flops (not shown in FIG. 5) drive an output cone of logic 104. The output of output cone 104 is coupled to the test wrapper cell 18 via the data input of the capture flip-flop 28 (see FIG. 1 for further discussion of flip-flop 28). The output of output cone 104 is also coupled to the either the customer specific logic 12 or a package pin (not shown in FIG. 5).

The system clock, CLK, is coupled to the CLK port of the embedded core 14 through a clock distribution network with a propagation delay t(CLK1). The embedded core system clock input port is coupled to the clock input port of the launch flip-flop 106 through an additional clock distribution network with an additional propagation delay t(CLK2). The delay t(CLK2) may be due to additional gates within the clock tree architecture and/or conductive interconnect propagation delay.

As mentioned in the description of FIG. 4, the timing specification for timing arcs relevant to FIG. 5 also depends on a reference point on the distribution network for the system clock. For timing measurements and timing validation to be reliable, a consistent reference point for the system clock CLK must be chosen. This reference point should be consistent for both input and output timing specifications (see FIGS. 4–5).

The output of output cone 104 has a routing delay, t(ROUTE). The delay t(ROUTE) is due to routing delay between the point at which the signal exits the embedded core 14 and the point at which it couples to the capture flip-flop 28. The wrapper clock, TRCLK, has a propagation delay, t(TRCLK), between the TRCLK package input pin (not illustrated in FIG. 5) and the point at which it is coupled to the capture flip-flop 28. Capture flip-flop 28 has an input setup time, t(FFISETUP), which is the least amount of time that data must be stable before the rising transition of the wrapper clock, TRCLK, in order for that stable data to be reliable captured into flip-flop 28. In FIG. 5, t(OSPEC) is the time it takes from the active edge occurrence of a clock input on flip-flop 106 to arrival time of new data at the input of flip-flop 28.

In order for proper testing of circuit timing, such as set-up time testing, hold time testing, output-to-clock-valid time testing, etc. to be tested with greater accuracy using a wrapper architecture, one or more of the circuits of FIGS. 6–8 are used to determine some critical timing characteristics illustrated in FIGS. 4–5.

FIG. 6 shows a first circuit which can be used for measurement of skew between the wrapper test clock, TRCLK, and the system clock, CLK. The clock skew is the value of t(TRCLK)−(t(CLK1)+T(CLK2)) as illustrated in FIGS. 4–5. Knowledge of the skew of the clock is needed to properly test the core 14 of FIGS. 1–3 to ensure timing specifications of the core 14 are not violated. In the circuit of FIG. 6, the wrapper clock, TRCLK, is coupled to the clock input ports of flip-flops 112 and 114. The system clock, CLK, is coupled to the clock input ports of flip-flops 110 and 116. The Q output port of flip-flop 110 is coupled to the data input of flip-flop 112. The Q output port of flip-flop 114 is coupled to the data input of flip-flop 116. The D input of flip-flop 110 is combinationally or sequentially coupled to a package pin in such a way that data on that package pin can be combinationally or sequentially applied to the D input of flip-flop 110. Similarly, the D input of flip-flop 114 is combinationally or sequentially coupled to a package pin so that data on that package pin can be applied to the D input of flip-flop 114. The Q output of flip-flop 112 is combinationally or sequentially coupled to a package pin in such a way that data available on the Q output of flip-flop 112 can be combinationally or sequentially propagated to that package pin for external detection. Similarly, the Q output of flip-flop 116 is combinationally or sequentially coupled to a package pin in such a way that data available on the Q output of flip-flop 116 can be combinationally or sequentially propagated to that package pin for detection.

Flip-flop 110 and flip-flop 114 both have a clock-to-output-valid delay, t(FFCOUT), which is the timing delay from a rising edge transition on the respective clock port of the flip-flop to the respective Q output port of the flip-flop. The flip-flops are constructed to be substantially similar to the launch flip-flop 22 of FIG. 4, so that the delay of flip-flops 110, 114, and 22 are substantially the same. Therefore, these flip-flops are typically constructed from the same flip-flop library cell layout. Flip-flops 112 and 116 have an input setup time, t(FFISETUP), which is the least amount of time that data input of each respective flip-flop must be stable before a rising transition on the respective clock input port of the respective flip-flop in order for that data to be reliably captured into the respective flip-flop. Flip-flops 112, 116, and 28 are constructed substantially similar so that their respective t(FFISETUP) delays are substantially the same.

The operation and utilization of FIG. 6 is subsequently discussed after FIGS. 7 and 8 are introduced.

FIG. 7 shows a two flip-flop circuit that can be used for measurement of skew between two clocks and measurement of input setup time for flip-flops. The wrapper clock, TRCLK, is coupled to the clock input port of flip-flop 118 and to the data input of flip-flop 120. There is a wrapper clock propagation delay, t(TRCLK) between the TRCLK input pin and the flip-flop 118 clock input port. The system clock, CLK, is coupled to the clock input port of flip-flop 120 and to the data input of flip-flop 118. There is a system clock propagation delay, t(CLK) between the CLK input pin and the flip-flop 120 clock input port. Flip-flop 118 and flip-flop 120 both have an input setup time, t(FFISETUP), which is the least amount of time before a rising clock transition on the clock input port that data must be stable on the data input of the respective flip-flop in order for that stable data to be reliably captured into the respective flip-flop. Flip-flops 118,120, and 28 are constructed to be substantially similar so that their respective input setup times, t(FFISETUP), are substantially equal. The Q output of flip-flop 118 is combinationally or sequentially coupled to a package pin (not illustrated in FIG. 7) in such a way that data available on the Q output port of flip-flop 118 can be propagated to that package pin. Similarly, the Q output of flip-flop 120 is combinationally or sequentially coupled to a package pin (not illustrated in FIG. 7) in such a way that data available on flip-flop 120 Q output port can be propagated to that package pin.

FIG. 8 illustrates a circuit that can be used for measurement of skew between the wrapper and the system clocks. The wrapper clock, TRCLK, is coupled to one data input of multiplexor 501. The system clock, CLK, is coupled to the other data input of multiplexor 501. A test signal, TE3, controls the select input port of the multiplexor. The output of multiplexor 501 is coupled combinationally to an output pin. The propagation delay from the multiplexor 501 output port to the output pin is t(OUT). The propagation delay from the wrapper clock, TRCLK, input pin to the multiplexor 501 input is t(TRCLK). The propagation delay from the system clock, CLK, input pin to the multiplexor input port is t(CLK).

The operation and use of FIGS. 6–8 will now be discussed.

First, some definitions need to be clarified. The term "launching a transition" on an input to a cone of combinational logic is the application of a 0→1 or 1→0 transition on that input port while holding all other inputs to the cone at a constant, or stable, value. In order to test input timing specifications for the core 14, we must be able to launch transitions onto core inputs which then propagate through zero or more combinational logic gates and are captured into a state element (latch or flip-flop) within the core 14. The transition should be launched with appropriate timing such that the input has an interval of time, derived from the timing specification, in which to propagate and be captured. Since input timing specifications vary from one port on the core to the next, we need a means to launch transitions at different times relative to the internal clock of the core 14.

Similarly for core outputs, circuitry must be provided to capture outputs from the core at an appropriate time interval after the application of the internal (system) clock of the core. The duration of these intervals varies from one port of the core to the next, as these intervals are directly derived from the output timing specifications for the core outputs. Note that with respect to testing the customer logic 12, the problem is symmetrical and reversed. That is, a circuit should provide the ability to launching transitions and holding stable values on customer logic inputs, and should provide a method for capturing, or observing, customer logic outputs. All these requirements are met by the design of a "wrapper" which surrounds the core and through which inputs to the core and outputs from the core pass (see FIGS. 1–3 which illustrate three different wrapper embodiments).

In order to measure timing requirements of the core 14, this wrapper architecture uses an independent test clock (TRCLK) from the core system clock (CLK) to provide the ability to precisely vary the interval between launch and capture events. The use of the circuits of FIGS. 6–8 in addition to a wrapper of from one of FIGS. 1–3 allows accurate measurement of the timing skew between the wrapper clock used for launching and capturing transitions and the internal core clock, along with accurate measurement of the wrapper cell input setup time and clock-to-output time such that these parameters can be precisely compensated for in application of the test program which was not previously possible in the prior art.

FIG. 4, as previously discussed, illustrates the delays involved in the launch of a transition from a TRCLK flip-flop in the wrapper to a CLK flip-flop in the core. In FIG. 4, the parameter that testing is targeted to determine is t(ISPEC), which is the specified maximum time that it takes for a transition launched at the core input port to traverse the cone of combinational logic that exists between the input port and the flip-flop that serves as the path endpoint, plus the input setup time of the flip-flop that serves as the path endpoints During input specification testing via full-scan used within the embedded core 14, an initial data value is first loaded into the launch flip-flop 22 through use of the serial scan. Simultaneously, initial values are placed into all other flip-flops that serve as off-path inputs to the input cone containing the path being tested to ensure a robust test. The complementary data value is placed on the data input port of the flip-flop 22 via flip-flop 20 (see FIG. 1) such that when the rising edge of TRCLK is applied at the pin and propagates to the flip-flop 22 with the delay t(TRCLK), that new value at the D input is transferred to the output Q of flip-flop 22 after a circuit delay by an amount t(FFCOUT). The value t(FFCOUT) is referred to as the "clock-to-out" time of the flip-flop 22. The transition then propagates along the route from the wrapper MUX 24 to the input port on the embedded core with a propagation delay of t(ROUTE). At this point the transition enters the input cone 100 and propagates along the targeted path and into the flip-flop 102 that serves as the endpoint of the path. The flip-flop has an input setup time, which is coupled with the propagation delay down the path through the input cone, with the net path length of delay being t(ISPEC).

The clock CLK is launched at the CLK input pin of the part and propagates through buffering and routing delay, t(CLK)=t(CLK1)+t(CLK2), to reach the capture flip-flop 102. If the rising edge on CLK reaches the flip-flop 102 earlier than the transition launched by TRCLK through the cone of logic 100 (taking into account flip-flop setup time), then the flip-flop will capture the data state that exists before the data transition (i.e., an initial data state) and indicate a failing condition. The failing condition indicates that setup time exceeds the setup time specification. Alternatively, if CLK reaches the flip-flop later than the TRCLK-initiated data transition through the cone 100, the flip-flop will capture the data state after the proper transition (i.e., a final data state) and will indicate a passing condition. An equation is constructed as follows to represent the "barely passing condition" (i.e., the condition in which the correct data value is captured, but with no time margin for error):

assertion_time(TRCLK)+t(TRCLK)+t(FFCOUT)=assertion_time(CLK)+t(CLK)−t(ISPEC)

where t(CLK)=t(CLK1)+t(CLK2) (see FIG. 4)

Of these parameters, t(ISPEC) is known since it is the given specification requirement. Also, t(ROUTE), which does not vary significantly with process variation or operating conditions because it is only a routing delay, can be estimated with reasonable accuracy and therefore places little if any detrimental uncertainty into the test measurements. In order to apply a path delay pattern, it is necessary to solve for assertion_time(TRCLK) relative to assertion_time(CLK), so that the test equipment can be configured to apply these edges at the correct time to obtain correct test measurements (i.e., compensate for clock skew and for launch flip-flop clock-to-output-valid delay t(FFCOUT)). This need leads to the following equation derived from the above equation:

assertion_time(CLK)−assertion_time(TRCLK)=t(TRCLK)−t(CLK)+t(ISPEC)+t(FFCOUT)

Define SKEW to be the difference in the propagation delays along the clock networks for the two independent clocks, as follows:

SKEW=t(CLK)−t(TRCLK)

Note that SKEW can be either positive or negative and the sign of SKEW is important according to the equations.

Substituting SKEW into the previous equation yields:

assertion_time(CLK)−assertion_time(TRCLK)=t(ISPEC)+t(FFCOUT)−SKEW

Note that SKEW and t(FFCOUT) will vary with process and operating point (voltage and temperature) because they both include delays through logic gates. Note also that in general, the CLK and TRCLK input may come into the integrated circuit containing the embedded core 14 through customer-specified logic 12, such that the buffering and routing delay before they reach the wrapper cells 16 and 18 and core 14 are unknown and not well controlled. This variability in SKEW does not prevent correct functional operation because the core uses only CLK and not TRCLK, so it operates independent of variability in SKEW. However, SKEW has a significant affect on the duration of the intervals that are used for testing of core input and output specifications.

A similar treatment of output delay specification testing from FIG. 5 leads to the derivation of the following equation:

assertion_time(CLK)−assertion_time(TRCLK)=−(SKEW+t(OSPEC)+t(FFISETUP))

In this equation, t(OSPEC) is the known output specification for the port being tested, t(FFISETUP) is the input setup time to the wrapper flip-flop that is used as the capture flip-flop, and the other parameters are defined identically to their use in testing input specifications.

This equation derived from FIG. 5 introduces the additional unknown, t(FFISETUP) in addition to SKEW and t(FFCOUT) which are unknowns from the previous equation derived from FIG. 4. Methods exist for management of SKEW between independent clocks, but these methods are very complex, involve significant amounts of extra logic, require significant design time, and are difficult to test. While skew can be managed in an expensive and complex manner, there are no prior art methods that compensate for or measure parameters other than SKEW, such as t(FFISETUP) and t(FFCOUT) to enable accurate core timing specification testing. Therefore, the presence of SKEW, t(FFCOUT), and t(FFISETUP) in the above equations is problematic for specification testing. This problem is solved using the circuits of FIGS. 6–8 to determine SKEW, t(FFCOUT), and t(FFISETUP) so that uncertainty can be removed from test data and exact timing specification testing of the core 14 can be performed in FIGS. 1–3.

The present invention teaches circuits and techniques that can be used to accurately measure, or calculate based on measurements, the timing parameters, SKEW, t(FFCOUT), and t(FFISETUP), so that these parameters can be compensated for during input and output specification testing of the embedded core 14. To take these measurements requires no additional equipment beyond that which is already employed in the testing of the integrated circuits to which this invention applies. FIGS. 6–8 teach several circuits and associated measurements that can be used independently to measure and calculate a subset of the three timing parameters needed (SKEW, t(FFCOUT), and t(FFISETUP)) in the above derived equation from FIGS. 4–5 in order to do accurate timing measurements. These circuits can be used together in a variety of configurations to also obtain by measurement and calculation the remainder of the required timing parameters in the above equations. The variety of possible combinations of these circuits leads to several configurations that serve to allow measurement and calculation of all three of the required timing parameters. Each circuit has separate advantages and disadvantages.

The first circuit illustrated in FIG. 6 independently provides a means for calculating the clock skew. It uses four flip-flops configured as shown in FIG. 6. Note that these flip-flops should be constructed to have identical output timing to the wrapper cells. This means that the flip-flops would also include, at their "Q" outputs, the wrapper MUX 24 (which is not shown in FIG. 6 for simplicity). Two equations characterize the time intervals involved in the transfer of data from flip-flop 110 to flip-flop 112 and from flip-flop 114 to flip-flop 116.

−t1=t(ISETUP(112))+t(ROUTE(110 to 112))+t(FFCOUT(110))+SKEW  (1)

where t1 is defined as:

t1=assert_time(CLK)−assert_time(TRCLK) as measured using flip-flops 110 and 112 t2=t(ISETUP(116))+t(ROUTE(114 to 116))+t(FFCOUT(114))−SKEW  (2)

where t2 is defined as:

t2=assert_time(CLK)−assert_time(TRCLK) as measured using flip-flops 114 and 116

These flip-flops 110–116 are intentionally placed very near each other on the die so that the following assumptions hold:

t(ROUTE(110 to 112))=t(ROUTE(114 to 116))=0, t(ISETUP(112))=t(ISETUP(116))=t(ISETUP), and t(FFCOUT(110))=t(FFCOUT(114))=t(FFCOUT)

where the above numbers 110–116 in the equation designate corresponding flip-flops in FIG. 6.

Taking advantage of these assumptions, and solving (1) and (2) for SKEW yields:

SKEW=−(½)(t1+t2).  (3)

The values, t1 and t2, can be easily measured as follows. First a data value (data1) is loaded into flip-flops 110 and 112, and the complementary data value (data1bar) is placed on the D input to flip-flop 110. Next, CLK is asserted to launch a transition from the output of flip-flop 110 to the data input of flip-flop 112. Then, TRCLK is asserted to capture the data on the data input port of flip-flop 112. There exists some minimum time interval between the assertion of TRCLK and CLK, at which the data value (data1bar) is correctly captured by flip-flop 112 (i.e., the transition which was launched meets setup time). At this point, the measured time interval is equal to t1. This measurement technique requires what is known to one skilled in the art as an "input search". The measurement is repeated on flip-flops 114 and 116, reversing the use of TRCLK with CLK, to determine the value of t2. Then, SKEW is calculated from equation (3) once t1 and t2 are known from the above teachings using FIG. 6. The other value that can be calculated from equations (1) and (2) based on the same set of measurements is the sum of t(ISETUP) and t(FFCOUT):

$$t(ISETUP)+t(FFCOUT)=(½)(t2-t1) \quad (4)$$

FIG. 7 is similar in concept to the teachings from FIG. 6 above. Similar to FIG. 6, FIG. 7 results in the following equations:

$$SKEW+t(ISETUP)=assert\_time(TRCLK, \text{with respect to flip-flop } 118)-assert\_time(CLK, \text{with respect to flip-flop } 118) =t3 \quad (5)$$

t3 is found by performing an input search on t(CLK) with respect to t(TRCLK) for flip-flop 118.

$$SKEW-t(ISETUP)=assert\_time(TRCLK, \text{with respect to flip-flop } 120)-assert\_time(CLK, \text{with respect to flip-flop } 120) =t4 \quad (6)$$

t4 is found by performing an input search on t(TRCLK) with respect to t(CLK) for flip-flop 120.

Solving for SKEW and t(ISETUP) from the above equations (5) and (6) (given two equations and two unknowns) results in:

$$SKEW=(½)(t3+t4), \text{ and} \quad (7)$$

$$t(ISETUP)=(½)(t3-t4) \quad (8)$$

The value of t3 is measured by doing an "input search" for the time interval between TRCLK and CLK at which a transition launched on TRCLK just meets setup time on flip-flop 118, and t4 is measured similarly using flip-flop 120.

A third circuit allows for direct measurement of clock skew. This circuit is shown in FIG. 8. The circuit may be used, as we later show, in conjunction with an additional flip-flop which provides measurement of the important parameter t(FFCOUT). By taking a propagation delay measurement first for TRCLK and second for CLK, and by subtracting the former from the latter, SKEW can directly be determined via FIG. 8. The circuits illustrated in FIG. 6 and 7, and their associated measurements can be used together to calculate t(FFCOUT) as follows, based on the existing measurements of t1, t2, t3, and t4:

$$t(FFCOUT)=(½)(t2-t1)-(½)(t3-t4). \quad (9)$$

Together, the circuits of FIG. 6 and FIG. 7 provide measurement of all three of the necessary timing parameters, but FIGS. 6 and 7 in conjunction really include more logic than the minimum necessary for determination of all these parameters. Alternatively, a hybrid circuit consisting of FIG. 6 and either of the two flip-flops and associated logic shown in FIG. 7 provides enough information to solve the applicable equations for t(FFCOUT) with no further measurements. Alternatively, the circuit of FIG. 7 can be used in conjunction with a MUX that provides a path to an output pin for each of the two flip-flops plus a path to an output pin for one of the two clocks (TRCLK or CLK). The measurement of the propagation delay of the relevant clock provides the additional information needed to calculate t(FFCOUT).

Another alternative is to use the circuit of FIG. 8 with the modification that the MUX is widened to accept at least three inputs. The spare input is then connected to a flip-flop circuit identical to either flip-flop 118 or flip-flop 120 in FIG. 7. Since SKEW is already calculated based on clock propagation delays of FIG. 8, t(ISPEC) and t(OSPEC) can be calculated based on two additional measurements, one of the clock-to-out of the output pin with respect to the clock of the flip- flop (with the MUX selected to enable that path), and a second measurement of the input setup of the clock pin that feeds the data input port of the flip-flop relative to the clock pin that feeds the clock input of the flip-flop.

Similarly, the circuit of FIG. 6 could be combined through use of a three or more input MUX whose third input is connected to one of the two clock lines and whose output is combinationally coupled to an output terminal of the integrated circuit (IC). This method again provides for determination of all three parameters (SKEW, t(FFCOUT), and t(FFISETUP)). Note that for this technique to be feasible, the output path provided for flip-flop 112 in FIG. 6 is combinational.

Another variation on this method is to use only one pair of flip-flops from FIG. 6 (either flip-flops 110 and 112 or flip-flops 114 and 116) and the entire circuit of FIG. 7, widening the MUX by at least one input, and using that input to provide an output path for the Q output of the flip-flop 112. This method also provides for determination of all three parameters (SKEW, t(FFCOUT), and t(FFISETUP)). Note that for this technique to be feasible, the output path provided for flip-flop 120 in FIG. 6 is made combinational.

Alternatively, methods of FIG. 6 and FIG. 7 could be combined in whole, or methods of FIG. 7 and FIG. 8 could be combined in whole, or all three methods could be combined in whole or in part so as to provide orthogonal verification of timing parameters. Any of these independent methods or the combined methods can be placed at multiple locations on the die and/or on multiple endpoints of the respective clock distribution networks so as to improve overall measurement accuracy. Therefore, many permutations and combinations of the circuits and method taught above with respect to FIGS. 6–8 are combinable to enable direct testing of core set-up times, hold times, and clock-to-output-valid which could not be achieved in the prior art core testing methodologies.

Thus it is apparent that there has been provided, in accordance with the present invention, a method and apparatus for speed path testing embedded cores isolated within a microcontroller integrated circuit (IC). Although the invention has been described and illustrated with reference to the specific embodiment, it is not intended that the invention be limited to these illustrative embodiments. The method and apparatus taught herein can be used for multi-chip modules (MCM) where the embedded core is one die among other die within a single IC package. Therefore, "embedded core" herein includes the case where a plurality of integrated circuits, including an embedded core, are not formed on the same piece of substrate but formed on segmented/different pieces of substrate where all the segmented/different pieces of substrate are packaged together within a single IC package. Latches or like storage elements may replace flip-flops taught herein. "Integrated circuit", as used herein, can mean either an entire integrated circuit or a portion of an integrated circuit either made on a semiconductor substrate or like substrate or an integrated circuit design file. The circuits taught herein can be used to validate input/output timing specifications or may be used to characterize the input/output timing of an embedded core 14 by doing iterative measurements while changing conditions on each iteration. Those skilled in the art will recognize that modifications and variations may be made without departing from the spirit and scope of the invention. Therefore, it is intended that this invention encompass all variations and modifications as fall within the scope of the appended claims.

What is claimed is:

1. An integrated circuit comprising:

an embedded core for executing computer instructions at an operational clock period;

logic within the integrated circuit and coupled to the embedded core; and a plurality of speed path testing cells coupled to the embedded core wherein the speed path testing cells in the plurality of speed path testing cells allow the embedded core to be speed path tested by a launch event and a capture event which are separated in time by a time period which is equal to or less than the operational clock period wherein the embedded core contains at least one serial scan chain of serially coupled storage elements and the plurality of speed path testing cells being coupled in another serial scan chain.

2. The integrated circuit of claim 1 wherein speed path testing is performed by providing a first clock cycle to launch a logical signal transition as the launch event through a circuit path and providing a second clock cycle to capture speed path test results as the capture event.

3. The integrated circuit of claim 1 wherein the embedded core is controlled by a system clock and the plurality of speed path testing cells are controlled by a test clock.

4. The integrated circuit of claim 1 wherein the at least one serial scan chain of serially coupled storage elements is coupled to the another serial scan chain of the plurality of speed path testing cells.

5. The integrated circuit of claim 1 wherein the logic within the integrated circuit contains at least one serial scan chain of serially coupled storage elements and the plurality of speed path testing cells being coupled in another serial scan chain.

6. The integrated circuit of claim 1 wherein the plurality of speed path testing cells perform the capture event by storing incoming data bits.

7. The integrated circuit of claim 1 wherein the plurality of speed path testing cells perform the launch event by creating a logical transition through a circuit path within the integrated circuit.

8. The integrated circuit of claim 1 wherein the plurality of speed path testing cells perform speed path testing of the logic within the integrated circuit.

9. The integrated circuit of claim 1 wherein the plurality of speed path testing cells perform speed path testing of the embedded core.

10. The integrated circuit of claim 1 wherein at least one of the speed path testing cells within the plurality of speed path testing cells comprises:

a multiplexor having an output coupled to the embedded core, a first input coupled to the logic within the integrated circuit, and a second input; and at least one storage element having an input coupled to received scan test data and an output coupled to the second input of the multiplexor.

11. The integrated circuit of claim 10 wherein the at least one storage element comprises:

a first flip-flop having a scan data input coupled to another speed path testing cell and an output; and a second flip-flop having a data input coupled to the output of the first flip-flop and an output coupled to the multiplexor.

12. The integrated circuit of claim 1 wherein at least one of the speed path testing cells within the plurality of speed path testing cells comprises:

a multiplexor having an output coupled to the logic within the integrated circuit, a first input coupled to the embedded core, and a second input; and at least one storage element having an input coupled to received scan test data and an output coupled to the second input of the multiplexor.

13. The integrated circuit of claim 12 wherein the at least one storage element comprises:

a first flip-flop having a scan data input coupled to another speed path testing cell and an output; and a second flip-flop having a data input coupled to the output of the first flip-flop and an output coupled to the multiplexor.

14. The integrated circuit of claim 1 wherein at least one of the speed path testing cells within the plurality of speed path testing cells comprises:

a first multiplexor having an output coupled to the embedded core, a first input coupled to the logic within the integrated circuit, and a second input;

at least one storage element having an input coupled to receive scan test data and an output coupled to the second input of the first multiplexor; and a second multiplexor having an output coupled to the logic within the integrated circuit, a first input coupled to the embedded core, and a second input coupled to the output of the at least one storage element.

15. The integrated circuit of claim 14 further comprising:

a third multiplexor having an output coupled to a data input of the at least one storage element, a first input coupled to an output of the embedded core, and a second input coupled to an output of the logic within the integrated circuit.

16. The integrated circuit of claim 14 wherein the at least one storage element comprises:

a first flip-flop having a scan data input coupled to another speed path testing cell and an output; and a second flip-flop having a data input coupled to the output of the first flip-flop and an output coupled to the second input of the first multiplexor and the second input of the second multiplexor.

17. The integrated circuit of claim 1 wherein at least one of the speed path testing cells within the plurality of speed path testing cells comprises:

a multiplexor having an output coupled to the embedded core, a first input coupled to the logic within the integrated circuit, a second input coupled to perform speed path testing, and a third input coupled to provide serial test data to the embedded core.

18. The integrated circuit of claim 1 wherein at least one of the speed path testing cells within the plurality of speed path testing cells comprises:

a multiplexor having an output coupled to the logic within the integrated circuit, a first input coupled to the embedded core, a second input coupled to perform speed path testing, and a third input coupled to provide serial test data to the logic within the integrated circuit.

19. An embedded core for use within an integrated circuit, the embedded core comprising:

a data processor portion coupled to a system clock; and a plurality of speed path test cells coupled to the data processor portion to enable speed path testing of the data processor portion, wherein each speed path test cell within the plurality of speed path test cells comprises:
  a multiplexor having an output coupled to an input of the data processor portion, a first input coupled to receive normal mode data, and a second input for receiving speed path testing data;
  a first storage element having an output coupled to the second input of the multiplexor, a data input, and a clock input for receiving a test clock that is different from the system clock; and
  a second storage element having an output coupled to the data input of the first storage element, a serial data input for receiving serial scan data, and a clock input for receiving a test clock that is different from the system clock, whereby the plurality of speed path test cells provide a logic transition to a circuit path within the data processor portion to test a signal propagation time through the circuit path.

20. The embedded core of claim 19 wherein the plurality of speed path test cells are used to determine a set-up time of the input of the embedded core.

21. The embedded core of claim 19 wherein the plurality of speed path test cells are used to determine a hold time of the input of the embedded core.

22. An embedded core for use within an integrated circuit, the embedded core comprising:
  a data processor portion coupled to a system clock; and
  a plurality of speed path test cells coupled to the data processor portion to enable speed path testing of the data processor portion, wherein each speed path test cell within the plurality of speed path test cells comprises:
    a first multiplexor having an output, a first input coupled to receive normal mode data from an output of the data processor portion, and a second input;
    a first storage element having an output coupled to the second input of the first multiplexor, a data input, and a clock input for receiving a test clock that is different from the system clock; and
    a second storage element having an output coupled to the data input of the first storage element, a serial data input for receiving serial scan data, and a clock input for receiving a test clock that is different from the system clock, whereby the plurality of speed path test cells perform a capture operation for data provided from an output of the data processor portion so that a circuit path within the data processor portion is speed path tested.

23. The embedded core of claim 22 wherein the plurality of speed path test cells are used to determine a clock-to-output-valid time of the output of the embedded core.

24. The embedded core of claim 22 wherein the plurality of speed path test cells are used to determine a output hold time of the output of the embedded core.

25. An embedded core for use within an integrated circuit, the embedded core comprising:
  a data processor portion coupled to a system clock; and
  a plurality of speed path test cells coupled to the data processor portion to enable speed path testing of the data processor portion, wherein each speed path test cell within the plurality of speed path test cells comprises:
    a multiplexor having an output coupled to the data processor portion, a first input coupled to receive normal mode data from an output of the data processor portion, and a second input for receiving speed path testing data;
    a first storage element having an output coupled to the second input of the multiplexor, a data input, and a clock input for receiving a test clock that is different from the system clock;
    a second storage element having an output coupled to the data input of the first storage element, a serial data input for receiving serial scan data, and a clock input for receiving a test clock that is different from the system clock; and
    a second multiplexor having an output, a first input coupled to an output of the data processor portion, and a second input coupled to the output of the first storage element.

26. The embedded core of claim 25 wherein each speed path test cell within the plurality of speed path test cells comprises:
  a third multiplexor having a first input, a second input coupled to the first input of the second multiplexor, and an output coupled to a data input of second storage element.

27. The embedded core of claim 25 wherein each speed path test cell within the plurality of speed path test cells: (1) generates speed path test transitions to test a speed path within the data processor portion; and (2) captures test outputs from the data processor portion based upon multiplexor settings.

28. An integrated circuit comprising:
  an embedded core for executing computer instructions at an operational clock period defined by a system clock;
  logic within the integrated circuit and coupled to the embedded core; and
  a plurality of speed path testing cells coupled to the embedded core wherein the plurality of speed path testing cells are coupled to a test clock whereby the system clock initiates a function of either a speed path transition launch or a speed path data capture and the test clock initiates a function opposite of the function enabled by the system clock so that a circuit path within the integrated circuit is speed path tested.

29. A method for speed path testing an embedded core within an integrated circuit, the method comprising the steps of:
  providing the integrated circuit, the integrated circuit containing the embedded core and microcontroller logic coupled to the embedded core, the integrated circuit containing a plurality of speed path test cells coupled to the embedded core;
  serially shifting data into at least one scan chain within the embedded core;
  serially shifting data into a test scan chain which serially couples each speed path test cell in the plurality of speed path test cells, the step of serially shifting data into the test scan chain being performed in parallel with the step of serially shifting data into the at least one scan chain; and
  speed path testing the embedded core using test data provided from the test scan chain.

30. The method of claim 29 wherein the step of speed path testing tests hold time, the step of speed path testing comprising the steps of:
  providing a system clock edge on a system clock; and
  providing a test clock edge on a test clock wherein the test clock edge results in data being changed to an input to the embedded core, the test clock edge being timed so that the data changes logic state at an interval later than the system clock edge, this interval being substantially equal to a hold time specification of the input to the embedded core.

31. The method of claim 29 wherein the step of speed path testing tests set-up time, the step of speed path testing comprising the steps of:

providing a system clock edge on a system clock; and providing a test clock edge on a test clock wherein the test clock edge results in data being changed to an input to the embedded core, the test clock edge being timed so that the data changes logic state at an interval earlier than the system clock edge, this interval being substantially equal to a set-up time specification of the input to the embedded core.

32. A method for speed path testing an embedded core within an integrated circuit, the method comprising the steps of:

providing the integrated circuit, the integrated circuit containing the embedded core and microcontroller logic coupled to the embedded core, the integrated circuit containing a plurality of speed path test cells coupled to the embedded core;

serially shifting data into at least one scan chain within the embedded core;

serially shifting data into a test scan chain which serially couples each speed path test cell in the plurality of speed path test cells, the step of serially shifting data into the test scan chain being performed in parallel with the step of serially shifting data into the at least one scan chain; and speed path testing the embedded core by capturing test data within the test scan chain wherein the test data is provided as output from the embedded core.

33. The method of claim 32 wherein the step of speed path testing performs clock-to-output-valid testing, the step of speed path testing comprising the steps of:

providing a system clock edge on a system clock, this system clock edge causing data on an output of the embedded core to be changed in logic state; and providing a test clock edge on a test clock wherein the test clock edge results in data being sampled at an output of the embedded core, the test clock edge being timed so that the data is sampled at an interval later than an edge provided on the system clock, this interval being substantially equal to a clock-to-output-valid specification of the output of the embedded core.

34. The method of claim 32 wherein the step of speed path testing tests output hold time, the step of speed path testing comprising the steps of:

providing a system clock edge on a system clock, this system clock edge causing data on an output of the embedded core to be changed in logic state; and providing a test clock edge on a test clock wherein the test clock edge results in data being sampled at an output of the embedded core, the test clock edge being timed so that the data is sampled at an interval later than an edge provided on the system clock, this interval being substantially equal to an output hold time specification of the output of the embedded core.

35. An embedded core integrated into a microcontroller, the embedded core comprising:

a processor portion containing a first plurality of storage elements which perform normal mode operations within the processor portion, the processor portion being adapted to receive a clock signal from a first clock source, the first plurality of storage elements coupled into a first scan chain; and a wrapper portion containing a second plurality of storage elements which do not perform normal mode operations within the processor portion but are used for testing the processor portion, the wrapper portion being adapted to receive a clock signal from a second clock source different from the first clock source, the second plurality of storage elements coupled into a second scan chain.

* * * * *